United States Patent [19]

Ozeryansky et al.

[11] Patent Number: 4,973,365
[45] Date of Patent: Nov. 27, 1990

[54] PROCESS FOR PRODUCING MONOCORE PRECURSOR NB3SN SUPERCONDUCTOR WIRE

[75] Inventors: Gennady Ozeryansky; Bruce A. Zeitlin, both of Cheshire, Conn.

[73] Assignee: Advanced Superconductors, Inc., Waterbury, Conn.

[21] Appl. No.: 362,231

[22] Filed: Jun. 6, 1989

[51] Int. Cl.$^5$ ...................... H01L 39/00; H01L 39/24
[52] U.S. Cl. .............................. 148/11.5 F; 428/614; 428/930; 29/599
[58] Field of Search .................. 148/11.5 F; 428/614, 428/930; 29/599

[56] References Cited

U.S. PATENT DOCUMENTS

| | | | |
|---|---|---|---|
| 3,158,327 | 5/1964 | Marancik et al. | 148/127 |
| 3,876,473 | 4/1975 | McDougall | 184/127 |
| 3,905,839 | 9/1975 | Hashimoto | 29/599 |
| 4,224,735 | 9/1980 | Young et al. | 148/11.5 Q |
| 4,435,228 | 3/1984 | Tachikawa et al. | 428/930 |
| 4,629,515 | 12/1986 | Imaizumi et al. | 148/11.5 Q |
| 4,646,428 | 3/1987 | Marancik et al. | 148/11.5 Q |
| 4,935,293 | 1/1979 | Madsen et al. | 148/133 |

FOREIGN PATENT DOCUMENTS 56-54707  5/1981  Japan .

OTHER PUBLICATIONS

B. A. Zeitlin, G. M. Ozeryansky, and K. Hemachalam, "An Overview of the IGC Internal Tin Nb3Sn Conductor", IEEE Trans. on Mag., vol. 21, No. 1, Mar. 1985.

R. E. Schwall, G. M. Ozeryansky, D. W. Hazelton, S. F. Cogan, and R. M. Rose, "Properties and Performance of High Current Density Sn-Core Process MF Nb3Sn", IEEE Transactions on Magnetics, vol. Mag. 19, No. 3, May 1983, pp. 1135–1138.

D. R. Dietderich, W. V. Hassenzahl, and J. W. Morris, Jr., "The Relationship Between Critical Current and Microstructure of Internal Tin Wire", 1985 ICMC, Cambridge, Mass.

D. W. Hazelton, G. M. Ozeryansky, M. S. Walker, B. A. Zeitlin, K. Hemachalam, E. N. C. Dalder, and L. Summers, "Internal Tin Process Nb3Sn Superconductors for 18 Tesla*", 1985 ICMC, Cambridge, Mass.

Primary Examiner—Theodore Morris
Assistant Examiner—David Schumaker
Attorney, Agent, or Firm—Helfgott & Karas

[57] ABSTRACT

The process for preparing a precursor Nb3Sn superconductor wire first assembling a billet comprising Nb rods surrounded by Cu material. A barrier material such as Nb is placed around the Cu and an outer stabilizer tube encases the billet. The billet is then preferably hot compacted after which it is extruded at an elevated temperature. A Sn rod is placed in the center of the billet and the entire composite is then drawn and twisted to the final size desired.

20 Claims, 2 Drawing Sheets

PROCESS FOR PRODUCING MONOCORE PRECURSOR NB3SN SUPERCONDUCTOR WIRE

BACKGROUND OF THE INVENTION

This invention relates to superconductor composite wire, and more particularly to a process for producing monocore Nb3Sn superconductor wire.

A type of superconductor wire that is commonly used comprises a plurality of Nb3Sn rods which are imbedded into a matrix material such as copper. There are three known methods for production of such wire. The first is known as the Bronze process, the second is known as the External Sn Over Cu Process or External Bronze Process, and the third is the Internal Sn or Tin Core Process.

The Internal Sn Process can best be demonstrated and explained from U.S. Pat. No. 3,905,839. In this patent, a Nb3Sn type superconductor composite wire is assembled by combining Nb wires in a Cu matrix, and utilizing a Sn or Sn-Cu rod core. The Sn is then permitted to diffuse into the Cu matrix and then into the Nb wires through the application of heat. Various examples are presented in this patent for forming the initial assembly after which a heat treatment occurs to diffuse the Sn into the material including the Nb.

In one arrangement described in this patent, a plurality of Nb rods coated with Cu were coaxially arranged around a Cu-Sn alloy center rod. This intermediate composite was then drawn on a draw bench to form a composite wire. The composite wire was then heat treated for several hours to provide diffusion of the Sn into the Cu and Nb to form the Nb3Sn wire.

In another example described in this patent, a plurality of apertures formed in a Cu shell were filled with the Nb rods, and a Sn rod was inserted in the center to form the intermediate composite body. The intermediate composite was then heat treated to cause the diffusion, following which the wire was drawn. Other examples were also presented.

However, in all of the process steps described, the composite was first formed after which diffusion occurred through a heat treatment step. It has been found, however, that this process leads to high processing costs and a disturbing incidence of product failure. In addition, the critical current densities available through this product are frequently lower than desired. Furthermore, the wire from this process results in being too brittle to be utilized effectively in coils and other superconductor applications.

A variation on the internal Sn process has been developed by Intermagnetics General Corp. and described in an article entitled "An Overview of the IGC Internal Tin Nb3Sn Conductor", published in IEEE Transactions on Magnetics, Vol. Mag 21, No. 1, Mar. 85. The process described can be referred to as a two-step process, and effectively utilizes two sequences of processing procedures. In the first sequence, a group of Nb rods are placed in a matrix of hexagonal Cu cells grouped together in an overall Cu shell. Some 300-1000 Nb wires can be compacted in a shell of this nature. The shell is typically evacuated, welded compacted, and hot extruded. At this point a Sn rod is inserted into the center and the entire composite assembly is wire drawn to form a hexagonal subelement. The second sequence comprises taking a plurality of these subelements and inserting them within a stabilizer tube whose interior surface has been coated with a barrier, such as Nb. The bundle of hexagonal subelements are combined into a hexagonal pattern by utilizing anywhere from 19 to 61 such subelements. The stabilizer tube with the subelement bundle is then again wire drawn until the final wire is formed.

While such two step procedure produces wires of a great numbers of filaments, the cost of conducting the two step procedure adds to the cost of the wire. Additionally, since subelements are first formed and then individually handled to combine them into the final assembly, there is a possibility of causing damage to the subelements as they are combined into the bundle and drawn again.

Even in forming single core conductors, the two-step process had been used, similar to making of a multicore conductor. Such single core conductors made through a two-step process were described in papers presented at the ICMC conference in Cambridge, Mass. in 1985, namely, "Internal Tin Process Nb3Sn Superconductors for 18 Tesla" and "The Relationship Between Critical Current and Microstructure of Internal Tin Wire". In both of these the wires used were formed by first forming as separate parts an extruded composite tube of Nb filaments in a Cu matrix and then inserting the Sn core. Then, a single such tube was inserted into a separate stabilizer tube with a barrier layer and then wire drawn.

Accordingly, there is need for an efficient process for producing Nb3Sn type superconductor wire which results in high current density, high ductility, reduced costs, simplification of metallurgical procedures, and low damage and failure rates.

SUMMARY OF THE INVENTION

Accordingly, it is an object of the present invention to provide a process for preparing a Nb3Sn superconnector wire at lower costs, producing a better bond, higher ductility, and avoidance of breaks.

A further object of the present invention is to provide a process for producing a monocore Nb3Sn superconnector composite wire.

Another object of the present invention is to provide a monocore Nb3Sn conductor wire using a single processing sequence to produce the final wire.

Briefly, in accordance with the present invention, there is provided a process for preparing a Nb3Sn superconnector wire by preparing an assembly of a billet comprising Nb rods surrounded by Cu. A barrier material is formed around the copper and an outer stabilizer tube is placed around the entire billet. The billet is then extruded at an elevated temperature. A Sn rod is then inserted in the center core of the billet to form a composite. The composite is then drawn to the final size wire desired.

In an embodiment of the invention, the billet is formed with a solid core and after the billet is compacted it is drilled and extruded with a mandrel placed into the hollow drilled out portion. The Sn is then inserted into the hollow core and the assembly is drawn to its final size and twisted.

In an embodiment of the invention, the Nb rods each have Cu jackets. The barrier is formed of Nb and the outer stabilizer tube is formed of Cu.

The aforementioned objects, features and advantages of the invention will, in part, be pointed out with particularity, and will, in part, become obvious from the following more detailed description of the invention, taken in conjunction with the accompanying drawing which forms an integral part thereof.

BRIEF DESCRIPTION OF THE DRAWING

In the drawing.

In the various figures of the drawing like reference characters designate like parts.

DESCRIPTION OF THE PREFERRED EMBODIMENTS

Figure 1:
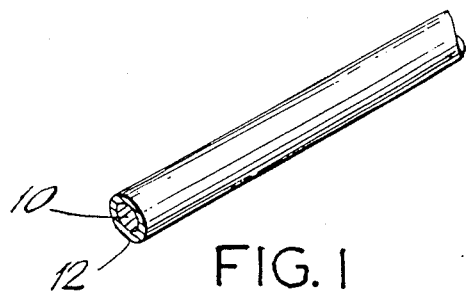
FIG. 1 shows an individual Cu jacketed Nb rod.
Figure 2:
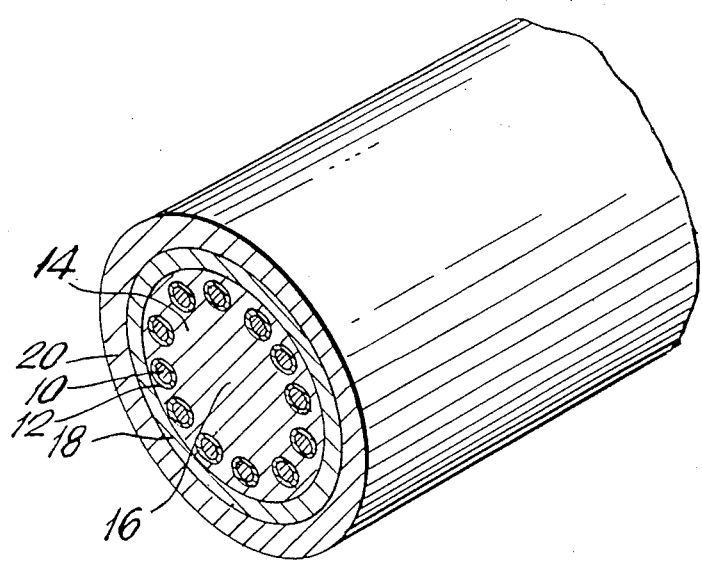
FIG. 2 shows a billet assembled with the rods of FIG. 1 embedded in a Cu shell, surrounded by a Nb barrier and placed within an outer Cu stabilizer tube.

In a preferred embodiment of the present invention, there is initially assembled a billet which is formed of a plurality of Nb filaments or rods 10. Generally, the Nb rods can be inserted directly. However, alternately, as shown each can be coated with a Cu jacket 12. These rods are assembled together inside a Cu matrix shell 14, as shown in FIG. 2. It should be noted, that the center core is solid, as shown at 16. This assembly is then wrapped with a barrier material 18. Such barrier can typically be Nb but can also be such other material as Ta, Ti, V, or Zr. The purpose of such barrier is to prevent the Sn, which will be inserted later, from poisoning the outer stabilizer tube during any heat treatment.

The entire assembly is then encased in a heavy wall stabilizer tube 20, presently shown as a Cu tube. Such assembly is shown in FIG. 2.

Figure 3:
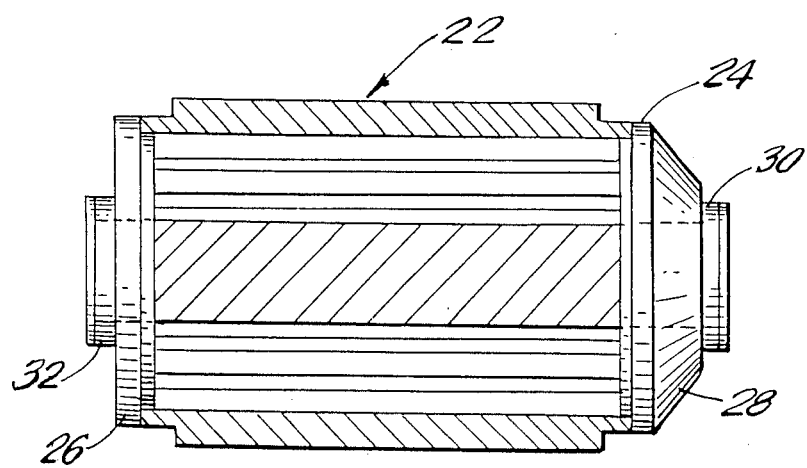
FIG. 3 is a vertical sectional through the billet with the billet evacuated and welded with lids on its fins.

Once assembled, as shown in FIG. 3, the assembly now shown as the billet 22 is evacuated and is welded. The welding includes positioning lid 26 on to the assembled composite tail as well as the nose 28 on to the assembled composite front. It is preferable to also provide a separate weld 30, 32 to the inner core section.

The billet is then compacted. Such compaction could take place at room temperature but preferably occurs at a raised temperature of approximately 650° C.–700° C. The compaction helps to increase the bond between copper/copper as well as copper/niobium and aids in the distribution of the materials within the billet.

After compaction, the billet is remachined and the core is drilled, typically with a gun drill operation. The billet is then hot extruded typically at temperatures between 500° C. and 750° C. If hydrostatic extrusion is utilized, the range of temperatures can be expanded to between room temperature and approximately 450° C. A mandrel is typically inserted into the center in order maintain the shape of the round tube during the extrusion.

Figure 4:
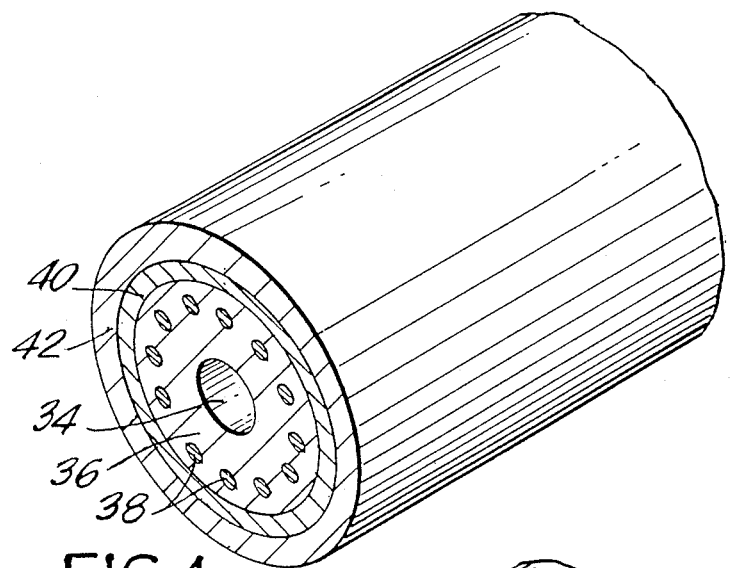
FIG. 4 is a cross sectional view of the billet with the center drilled out, after compaction and extrusion.
Figure 5:
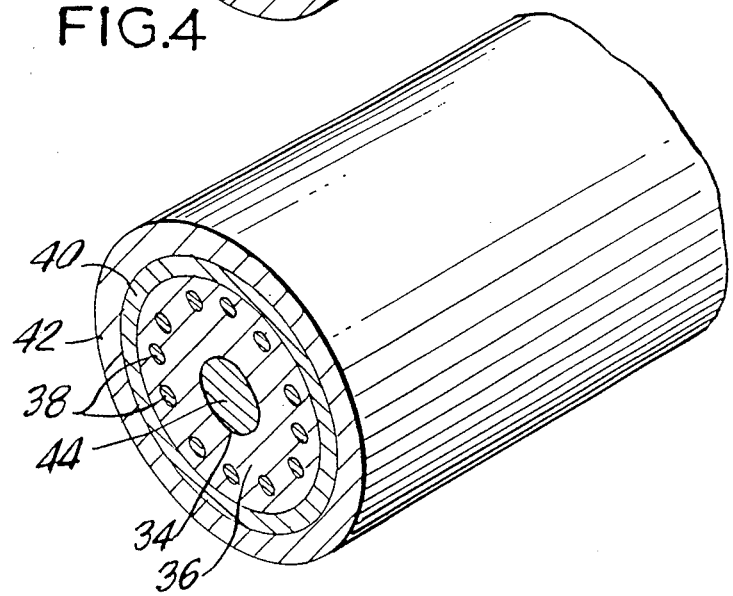
FIG. 5 is a view similar to that of FIG. 4 showing the insertion of a Cu jacketed Sn rod in the center core.

The resulting structure is shown in FIG. 4 which shows the center drilled hole 34 surrounded by the Cu material 36 in which the Nb rods 38 are disbursed. The outer barrier layer 40 remains intact and protects the stabilizer tube 42. At this point the Sn source in the form of a center rod is inserted into the tube. As shown in FIG. 5, such Sn rod 44 fits into the previously provided centerhole 34.

Figure 6:
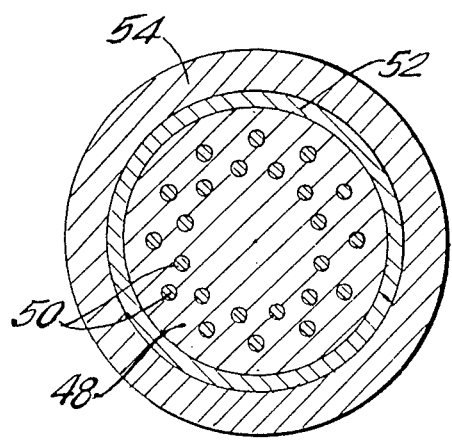
FIG. 6 shows the cross sectional view of the final wire after being drawn.

The composite assembly is then drawn at room temperature to its final size and twisted. The final product is shown in FIG. 6 which shows that the Sn from the core has diffused outwardly into the surrounding Cu to form a Cu-Sn bronze matrix 48 and the rods have been converted by reaction with Sn to rods 50 of $Nb_3Sn$. The barrier 52 has also received the Sn diffusion and likewise has been partially converted to $Nb_3Sn$. However, in such conversion it absorbed the Sn thereby preventing the Sn diffusion into the outer Cu stabilizer tube 54.

Typically, the reaction of the wire will then take place through a heat treatment operation conducted as part of a finishing process. Such heat treatment operation is typically conducted at approximately 650° C.–700° C.

It should be noted, that the hot extrusion process occurred before the Sn is inserted. As a result, it avoids the Sn diffusion until final annealing. At the same time, the extrusion provides an improved bond to the material. Likewise, even though the extrusion takes place before the Sn is inserted, it has been found preferable to first compact, and preferably hot compact the material, even before the extrusion occurs.

It should also be noted that the barrier layer utilized is substantially thicker than usual. Typically, approximately 4"5% of the material has been previously used as the barrier layer. At present approximately 2–20% was used and preferably about 11% was utilized for the barrier. Such thicker barrier provided more protection after drawing to the final diameter. Current densities of about 1,500–1700 amps/$m^2$ in non-copper region can be achieved through this wire even though it is effectively a monocore wire.

The wire resulting from this process is less expensive because of the reduced number of steps to manufacture the wire as compared to the two step process. Furthermore, a superior wire can be achieved since there is less opportunity for damage to subelements. However, it should be appreciated that there are a reduced number of Nb filaments as compared to utilizing the two step process.

While Nb filaments have been discussed, it should be appreciated that the Nb can also be alloyed with other materials and Nb alloyed filaments used. Such alloying can be done to enhance various properties such as to enhance the high field properties, for example to 12–21 Tesla. Such alloying could also be used to increase the current density Jc. By way of example, it has been found that such alloying can increase current density Jc at the medium fields of 8–10T.

Various alloys of Nb have been used and are commercially available. By way of example, Nb-1.2%y5Ti and Nb-7.5% Ta.

The Nb-hafnium and Nb-zirconium alloys have also been used in this connection. It may also be possible to utilize other alloys such as Nb-Al and Vanadium-gallium alloys.

Likewise, in discussing the use of the Sn material as the source, it should be understood that the Sn can also be alloys. Such alloys are usually achieved with copper in order to increase the hardness of the Sn. This leads to an improvement of drawability of the wire. Zn can also be used for the alloy in order to increase the hardness of the Sn and speed of diffusion of the Sn into the copper. Mg, Ga and In can also be used to improve the high field properties. Alloying of Sn with Ti was utilized to substitute alloying of the Nb filaments with Ti.

In a similar manner, it should also be understood that the Cu matrix heretofore discussed could also be an alloy. Alloying of the Cu matrix with Ti can be used to improve high field properties similar to the effect of alloying the Nb filaments with Ti. Alloying of the Cu matrix with Sn, Ga, In, Be and $Al_2O_3$ are also possible and could improve electrical and mechanical properties of the wire.

While particular embodiments of the present invention have been shown, it will be obvious to those skilled in the art their changes in modifications may be made without departing from the invention in its broader aspects. Therefore, the aim in the appended claims is to cover all such changes and modifications within the true spirit and scope of the invention. The matter set forth in the foregoing description and drawings is offered by way of illustration only and not as a limitation. The actual scope of the invention is intended to be defined in the following claims when viewed in their proper perspective based on the prior art.

We claim:

1. A process for preparing a precursor $Nb_3$ Sn superconductor wire comprising:
   a) assembling a billet comprising a core of Nb containing rods surrounded by Cu containing core, a barrier material around the Cu-Nb core, and an outer stabilizer tube;
   b) extruding the billet;
   c) inserting a Sn containing rod in the center core of the billet to form a composite; and
   d) drawing the composite to the final size.

2. The process as in claim 1, wherein the billet contains a solid Cu core and comprising the step of drilling the core prior to inserting the Sn.

3. The process as in claim 2, wherein the core is drilled before the extrusion and a mandrel is inserted in the core during the extrusion.

4. The process as in claim 1, and further comprising the step of compacting the billet prior to extruding.

5. The process as in claim 4, wherein the compacting is achieved at substantially room temperature.

6. The process as in claim 4, wherein the compacting is achieved at an elevated temperature.

7. The process as in claim 6, wherein the compacting is achieved at a temperature of about 650° C.–7000° C.

8. The process as in claim 1, wherein the extrusion occurs at an elevated temperature.

9. The process as in claim 1, wherein the extrusion occurs at a temperature of between room temperature and 8000° C.

10. The process as in claim 1, wherein the Nb rods have Cu jackets.

11. The process as in claim 1, wherein the billet is evacuated, welded, compacted, and the core drilled before the extrusion.

12. The process as in claim 1, wherein the barrier material is selected from the group consisting of Nb, Ta, V, or combinations thereof.

13. The process as in claim 1, wherein the barrier is tightly formed about the material.

14. The process as in claim 1, wherein the stabilizer tube is of Cu material.

15. The process as in claim 1, wherein the drawing is carried out at room temperature.

16. The process as in claim 1, wherein the barrier comprises about 2–20% of the billet.

17. The process as in claim 16, wherein the barrier comprises about 11% of the billet.

18. The process as in claim 1, wherein said Nb containing rods are Nb alloyed filaments.

19. The process as in claim 1, wherein said Cu containing core is a Cu alloy matrix.

20. The process as in claim 1, wherein said Sn containing rod is a Sn alloy source.

* * * * *